United States Patent [19]

Ichikawa et al.

[11] Patent Number: 4,746,536

[45] Date of Patent: May 24, 1988

[54] METHOD FOR SELECTIVE CHEMICAL PLATING

[75] Inventors: Yukio Ichikawa; Satoshi Usui, both of Iwaki, Japan

[73] Assignee: Kureha Kagaku Kogyo Kabushiki Kaisha, Tokyo, Japan

[21] Appl. No.: 945,298

[22] Filed: Dec. 17, 1986

[30] Foreign Application Priority Data

Dec. 18, 1985 [JP] Japan .................................. 60-285242

[51] Int. Cl.⁴ ............................................. B05D 3/06
[52] U.S. Cl. ..................................... 427/54.1; 427/98
[58] Field of Search .............................. 427/53.1, 54.1

[56] References Cited

U.S. PATENT DOCUMENTS 4,486,463 12/1984 Rubner et al. ........................ 427/98
4,615,907 10/1986 Boeke et al. ....................... 427/53.1

Primary Examiner—John H. Newsome
Attorney, Agent, or Firm—Wenderoth, Lind & Ponack

[57] ABSTRACT

In the process of chemical plating on a formed article composed of a polyarylene sulfide or a composition comprising a polyarylene sulfide as the predominant resin component, a method for selective chemical plating is provided, which comprises irradiating a portion not to be plated of the formed article with light of a wavelength of 0.1 nm to 800 nm and then subjecting the formed article to chemical plating.

5 Claims, No Drawings

METHOD FOR SELECTIVE CHEMICAL PLATING

BACKGROUND OF THE INVENTION

1. Field of the Art

This invention relates to a method of conducting chemical plating selectively on a specific position or portion of a formed article consisting essentially of a polyarylenesulfide (hereinafter referred to as PAS) or a composition thereof. In other words, this invention relates to a method of producing a PAS formed article treated with selective chemical plating.

2. Description of the Prior Art

Recently, PAS or PAS compositions reinforced with fibers and the like have attracted much attention as a new engineering plastic material having excellent heat resistance, chemical resistance, nonflammability, mechanical properties and electrical properties. An attempt to use the PAS or PAS compositions as a substrate for printed wiring board has been disclosed in Japanese Laid-Open Patent Publication Nos. 96588/1982 and 3991/1984, etc.

Generally, to produce a printed circuit on a plastic substrate, so-called subtractive methods or additive methods have been used. Because of fewer process steps, suitability for high density wiring, etc., circuit-forming techniques according to an additive method utilizing chemical plating have been popularly used.

In such additive methods, those portions of a PAS formed article which should not be plated are preliminarily masked with an adhesive ink, a masking ink or the like, and then the masked article is subjected to chemical plating. Therefore, the methods have problems in that the adhesive ink, the masking ink or the like used for the masking must have sufficient durability against the severe conditions of the subsequent production steps. Thus, it has been desired to develop a technique which can form precise circuit patterns by means of selective chemical plating without using such a masking ink or adhesive ink.

On the other hand, as an additive method which directly forms circuit patterns, a so-called PD-R method, photo-form method and others have been known. All of these methods are positive type circuit pattern-forming methods in which only the parts irradiated with light can be plated. Thus, these methods are disadvantageous in that plating of the through-hole parts may be difficult.

It is desirable, not only from the viewpoint of printed wiring but also in view of the various uses of PAS formed articles, because of their excellent properties, to provide a method of applying selective chemical plating onto PAS formed articles.

SUMMARY OF THE INVENTION

We have conducted intensive research on a method of carrying out chemical plating selectively on a PAS formed article, and have found that by irradiating the PAS formed article with light of a specific wavelength, the portions thus irradiated therewith cannot be chemically plated. On the basis of this and other findings, we have developed a method of selectively plating a PAS formed article, which comprises preliminary irradiating a portion of a PAS molded article which need not be plated with light of a specific wavelength and then subjecting the PAS formed article to chemical plating, whereby the portions irradiated with the light are not plated and only the other portions not irradiated therewith can be plated.

More specifically, the method for selective chemical plating according to the present invention is characterized in that, in the chemical plating of a formed article composed of a polyarylene sulfide or a composition comprising as a redominant resin component a polyarylene sulfide, the portions of the formed article which need not be plated are preliminarily irradiated with light of wavelength of 0.1 to 800 nm, and then the article is subjected to chemical plating.

According to the method of the present invention, an electroconductive metal circuit can be readily plated selectively on a PAS formed article by conducting chemical plating after irradiation with light of a specific wavelength on specified portions of the formed article. Thus, precise printing wiring can be readily formed on a PAS board without using a masking ink or the like. Moreover, the present method is also advantageous in that through-hole portions can be readily plated because the method is a negative type pattern-forming method.

In this connection, the production of such a printed wiring board is merely an example of applications of the present invention, and it is, of course, possible to use the present method effectively for other applications wherein selective plating on PAS formed articles is required.

It was indeed unexpected that chemical plating on a PAS formed article can be controlled by irradiation with light of a specific wavelength.

DETAILED DESCRIPTION OF THE PREFERRED EMBODIMENT OF THE INVENTION

PAS formed article

PAS

The PAS used in the invention is well known. It is a homopolymer or a copolymer comprising, as a principal structural unit, the repeating unit of the formula: $-(Ar-S)-$ wherein, Ar denotes an arylene group. The PAS can contain a small amount of branched bonding or crosslinked bonding, such as those represented by

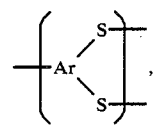

provided that the PAS comprises the above repeating unit as a principal structural unit.

The —Ar— is illustrated by:

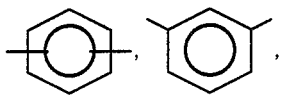

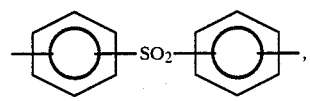

-continued

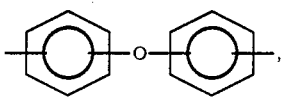

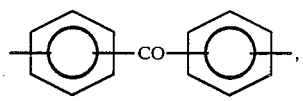

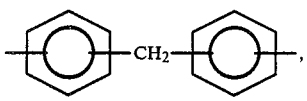

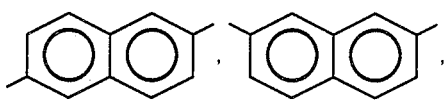

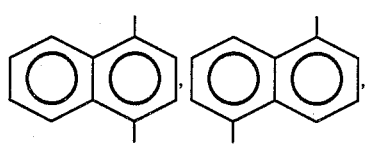

wherein R denotes an alkyl or an alkoxy group, particularly that having approximately 1 to 4 carbon atoms. The $$-Ar'\diagup\diagdown$$

is illustrated by

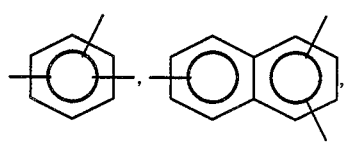

etc. Among the

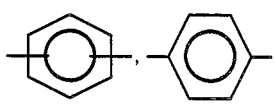

is preferred.

The PAS particularly preferred is exemplified by a poly-p-phenylenesulfide (PPS) or a p/m-phenylenesulfide block copolymer containing not less than 90 molar percent of p-phenylensulfide unit

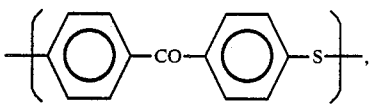

as a principal structural unit of the polymer or a mixture thereof.

The PPS can contain less than 10 molar percent of the other copolymer unit. Such copolymer units include, for example, m-phenylenesulfide unit

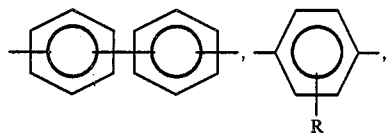

diphenyl ketone sulfide unit

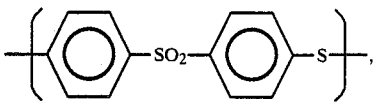

diphenylsulfone sulfide unit

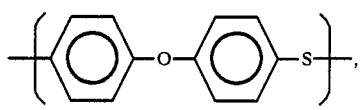

diphenyl ether sulfide unit

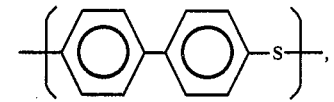

bisphenylsulfide unit

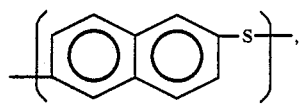

2,6-naphthalenesulfide unit

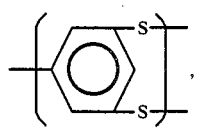

trifunctional unit

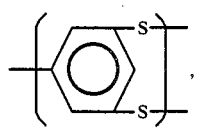

and the like. It is desirable, however, that the trifunctional unit be contained in an amount of not more than 1 molar percent. As such PPS, those synthesized according to any reasonable method can be used. Such a method comprises subjecting a dihaloaromatic compound as mentioned above and an alkali metal sulfide to a dehalogenation/sulfidization reaction preferably in an organic amide solvent. For example, the methods disclosed in U.S. Pat. No. 3,354,129 specification, Japanese Patent Publication No. 12,240/1977, as well as Japanese Patent Laid-Open Publications Nos. 7,332/1986 and 14,228/1986 can be used. The polymers thus obtained can be increased in melt viscosity by heat-treatment.

The PAS to be used in the present invention desirably has a melt viscosity in the range of from 50 to 100,000 poise measured under the conditions of a temperature of 310° C. and a shear rate of 200 sec$^{-1}$.

The PAS formed articles to be chemically plated can be those composed of "a PAS composition comprising a PAS as a principal resin component" containing a component other than PAS, as well as those composed of PAS alone (including mixtures of various PAS polymers). Such PAS compositions can be blends of PAS with various fillers such as powder fillers, e.g. mica, $TiO_2$, $SiO_2$, glass powder, $Al_2O_3$, $CaCO_3$ and carbon black, and various synthetic resins such as polyimide, polyamide, polyether ether ketone, polysulfone, polyether sulfone, polyether imide, polyarylene, polyphenylene ether, polycarbonate, polyalkyleneterephthalate, polyolefine, ABS, polyvinyl chloride, polymethylmethacrylate and fluorine resin. In the case where such resins are used in combination with a PAS, a predominant amount of the total resin components should be the PAS.

The PAS formed articles particularly preferred are those comprising a combination of the PAS and fibrous reinforcing materials. Such fibrous materials can be any of synthetic inorganic fibers (e.g., carbon fiber, glass fiber, silica fiber, alumina fiber, and ceramic fibers), natural inorganic fibers (such as rock wool), synthetic organic fibers (e.g., aromatic amide fibers, phenol fibers, and cellulose fibers), and natural organic fibers (e.g., pulp, cotton). Particularly, in view of heat resistance, strength, economy and other considerations, glass fiber is preferred. Of course, the shape, size, etc. of the fibers are not especially restricted. Fibers subjected to surface-treatment are also useful.

It is preferable that the amount of PAS be not less than 50% by volume of the total composition. If the amount of the PAS is less than this range, the characteristics of the PAS cannot be sufficiently exhibited. In this connection, the percentage by volume can be calculated from the weight of each component and the specific gravity thereof.

The method for forming the PAS or PAS composition to obtain the PAS formed article to be used in the present invention is not particularly restricted; injection molding, extrusion, compression molding, etc. can be employed. Here, the term "formed article" in the present specification is intended to include pellets, granules and the like.

When the method of the present invention is employed to produce a printed wiring board, the desired circuit pattern can be formed on an injection-molded substrate having an optional shape, and also a so-called three-dimensional printed wiring board can be readily produced in a simple fashion. Moreover, when the method of the invention is applied to a sheet- or film-like formed article, it is of course possible to obtain a flexible printed wiring board.

IMPARTING SELECTIVE PLATING PROPERTY

The selective plating property according to the present invention is provided by irradiating with a light of a specific wavelength the portion of the PAS molded article which need not be plated.

The light to be used for the irradiation has a wavelength in the range of from 0.1 to 800 nm, preferably from 300 to 600 nm, more preferably from 300 to 404 nm. Irradiation conditions which are ample for preventing adhesion of chemical plating on the PAS formed article can be selected. It is also possible to decrease the irradiation time by dispersing a photosensitizer in the PAS or PAS composition, or by conducting irradiation in an activated atmosphere such as one comprising molecular oxygen. The irradiation time depends upon the distance between a light source and the article to be irradiated and the atmosphere of irradiation, as well as the intensity of the light. However, the irradiation time is preferably in the range of from not less than 0.01 second to less than 1,000 hours. If the irradiation time is less than 0.01 second, the desired effects of light irradiation cannot be obtained, whereas productivity becomes worse with an irradiation time of 1,000 hours or longer. It is particularly preferable that the irradiation time be in the range of from 0.01 second to 100 hours.

Examples of suitable light sources are a high-pressure mercury-vapor lamp, low-pressure mercury-vapor lamp, ultra-high-pressure mercury-vapor lamp, xenon lamp, carbon arc lamp, fluorescent lighting, and halogen lamp. In order to impart selective plating properties to the PAS formed substrate, the substrate is masked with an aluminum foil or the like, or alternatively by using a negative resist to produce a masked circuit pattern thereon, and is then irradiated with the light. After sufficient irradiation, the mask is removed therefrom, and the resulting substrate is subjected to catalyzing treatment according to a conventional method and then to chemical plating. Alternatively, light irradiation can be carried out after the catalyzing treatment.

Prior to the irradiation, the surface of the article can be roughened by physical or chemical roughening treatment such as mechanical treatment or a treatment using an organic solvent (e.g., carboxylic acid amides, ethers, and ketones) or a solution of oxidizing agents (e.g., chromic acid, permanganic acid, and sulfuric acid) or Lewis acids (e.g., $AlCl_3$, $TiB_4$, $SbF_5$, $SnCl_4$, and $BF_3$). Thus, the adhesion between the metallic layer formed by the chemical plating and the molded substrate can be increased. By such roughening treatment, the effect of the light irradiation is not lost as long as the light irradiation is conducted after the roughening treatment.

CHEMICAL PLATING

The chemical plating process itself is not essentially different from those conventionally used or usable on plastics, particularly on a PAS. Chemical plating is also referred to as non-electrode plating or non-electrolysis plating. Chemical plating on plastics is a well known technique, the details of which can be formed in basic textbooks in this field such as Encyclopedia of Polymer Science and Technology, Vol. 8, pp 639 to 666, Interscience Publishers.

Specifically, such chemical plating consists essentially of soaking an article to be plated in a bath comprising an aqueous solution containing a metal salt, a reducing agent (such as sodium hypophosphite, anhydrous sodium sulfite, formalin, or hydroquinone) and a buffering agent (such as a formate salt or an acetate salt) to reduce the metallic ion of the metal salt and deposit the resulting metal on the surface of the article.

The metal to be used for the plating is not restricted. Any metal which can be chemically plated, such as copper, nickel, or silver can be used. In the case where the method of the invention is applied for the production of printed wiring boards according to an additive method, chemical copper plating is particularly useful.

As described above, a catalyzing treatment can be carried out before the chemical plating procedures. The catalyzing treatment is also a step of conventional chemical plating processes and is described in the foregoing well-known literature.

EXPERIMENTAL EXAMPLES

Synthesis Example 1

A 10-liter autoclave was charged with 4.5 kg of N-methylpyrrolidone (NMP) and 1.696 kg (10 mols as $Na_2S$) of $Na_2S.5H_2O$ containing 46.02% by weight of $Na_2S$, and the resulting mixture was heated gradually to 202° C. under a nitrogen atmosphere to distill away 683 g of water, 417 g of NMP and 0.31 mol of $H_2S$. The amount of water in this system was about 1.33 mols per mol of $Na_2S$. After the system was cooled to 130° C., 1.439 kg of p-dichlorobenzene (PDCB) (PDCB/$Na_2S$ molar ratio: 1.01/1.00) and 0.75 kg of NMP were added thereto, and the resulting reaction mixture was subjected to polymerization at 210° C. for 10 hours. Then, 466 g of water was pressurized into the polymerization slurry by nitrogen gas (total water amounted to 4 mols per mol of $Na_2S$), and polymerization was continued at 260° C. for an additional 10 hours. After cooling, pearl-like poly-p-phenylenesulfide (PPPS) was separated by screening from NMP, PPS oligomer, etc. The PPPS thus obtained was then washed repeatedly with deionized water and dried at 100° C. for 3 hours to produce PPPS. The yield of this polymer was 88%, and the melt viscosity thereof was 4,000 poise measured under the conditions of 310° C./200 sec$^{-1}$.

The polymer obtained by the above process is referred to herein as Polymer A.

Synthesis Example 2

[A] A 10-liter autoclave was charged with 4 kg of NMP and 1.870 Kg (11 mols as $Na_2S$) of $Na_2S.5H_2O$ containing 45.9% by weight of $Na_2S$, and then 762 g of $H_2O$, 742 g of NMP and 9 g of $H_2S$ were distilled away therefrom by gradually heating the resulting mixture to 200° C. under an $N_2$ atmosphere. Thus, $H_2O$ in the system amounted to 1.24 mols per mol of $Na_2S$. After the system was cooled to 130° C., 1547 g of m-dichlorobenzene (MDCB) (M-DCB/$Na_2S$ molar ratio: 0.98/1.00), 2110 g of NMP and 50 g of $H_2O$ were added thereto (whereby the water amounted to 1.5 mols per mol of $Na_2S$), and then polymerization was carried out at 220° C. for 2 hours and at 230° C. for 7 hours. The mean polymerization degree was 80, which was calculated from the amount of the terminal Cl in the polymer sample.

[B] A 20-liter autoclave was charged with 7.5 kg of NMP and 3.060 kg (18 mols) of $Na_2S.5H_2O$ containing 45.9% by weight of $Na_2S$, and then 1.268 kg of $H_2O$, 1.354 kg of NMP and 17.3 g of $H_2S$ were distilled away therefrom by gradually heating the resulting mixture to 200° C. under $N_2$ atmosphere. Thus, $H_2O$ in the system amounted to 1.17 mols per mol of $Na_2S$. After the system was cooled to 140° C., 2.636 kg of PDCB (PDCB/$Na_2S$ molar ratio is 1.025), 2.5 kg of NMP, 103.3 g of $H_2O$ ($H_2O$ amounted to 1.5 mols per mol of $Na_2S$) and 2315 g of the poly-m-phenylenesulfide (PMPS) slurry obtained in [A] above (the slurry contained 3.087 mols of PMPS polymer) were added thereto, and then the resulting mixture was subjected to polymerization at 220° C. for 10 hours.

Thereafter, 1.296 kg of $H_2O$ was pressurized into the polymerization system (then the total water amounted to 5 mols per mol of $Na_2S$), and polymerization was continued at 260° C. for 5 hours. Post-treatment was conducted similarly as in Synthesis Example 1 to obtain a phenylenesulfide block copolymer having a melt viscosity of 1,600 poise (measured at 310° C./200 sec$^{-1}$) in a yield of 85%. The para (p)/metha (m) ratio of the copolymer was 85/15 according to infrared spectrum measurement. The chain length of the p-phenylenesulfide repeating unit was about 450, which was calculated from the chain length (140) of the m-phenylenesulfide repeating unit and the molar ratio (0.85) of the p-phenylenesulfide.

The polymer thus obtained is herein referred to as Polymer B.

EXAMPLE 1

Each of the Polymers A and B was pressed at 310° C. and then rapidly cooled in water at 0° C. to produce amorphous sheets of 0.3-mm thickness.

Crystalline sheets were also prepared by heating the rapidly cooled amorphous sheets at 260° C. for 20 minutes to crystallize the polymer.

Each surface of the amorphous sheets and the crystalline sheets was covered with a negative type aluminum mask having a circuit pattern and then irradiated with a high-pressure mercury-vapor lamp UM-102 manufactured by Ushio Denki K.K., Japan (representative wavelengths: 302.2 nm, 313.2 nm, 334.1 nm, 365.0 nm, 404.7 nm, 435.8 nm, 546.1 nm, 577.0 nm, etc.) for 10 hours at a distance of 20 cm from the light source.

Thereafter, the aluminum mask was removed and chemical copper plating was conducted in accordance with the following procedure.

The entire surface of each sheet was subjected to catalyzing treatment at 25° C. for 10 minutes with the catalyzing liquid given below, washed with water, treated with the chemical copper plating liquid given below at 0° C. for 20 minutes, washed with water and then dried.

Catalyzing liquid: 0.020 g $PdCl_2$+0.2 g $SnCl_2$+10 ml $HCl/H_2O$, 100 ml in total.

Chemical copper plating liquid: 1.56 g $CuSO_4.5H_2O$+1.0 g $NaOH$+5.0 g $NaKC_4H_4O_6.4H_2O$+1.0 ml 37% formalin/$H_2O$, 100 ml in total.

The results are shown in Table I.

TABLE I

| | | Plating Properties | |
|---|---|---|---|
| | Samples | portion irradiated with light | portion not irradiated with light |
| Polymer A | amorphous sheet | x | ○ |
| | crystalline sheet | x | ○ |
| Polymer B | amorphous sheet | x | ○ |
| | crystalline sheet | x | ○ | wherein ○: plated, x: not plated.

It can be seen from the results above that, regardless of whether the sheet is amorphous or whether it is crystalline, only the portion not irradiated with light is plated, and thus the selective chemical plating can be conducted by light irradiation.

EXAMPLE 2

Chemical plating was carried out as in Example 1 except that the samples used in Example 1 were subjected to roughening treatment with a chromate solution prior to or after light irradiation.

The chromate solution used had a composition of 0.2 g $Na_2Cr_2O_7.2H_2O$ and 100 ml $H_2SO_4$. The roughening conditions were 25° C. and 20 minutes.

As a result, the sample which had been subjected to the roughening treatment prior to light irradiation was selectively plated, while the sample which had been subjected to the roughening treatment after light irradiation was not selectively plated.

EXAMPLE 3

Each of the Polymers A and B into which 40% by weight of glass fiber had been admixed, as well as Ryton PPS (grade R-4) (trade name, commercially available from Phillips Corporation) were subjected to injection molding under the conditions of a resin temperature of 340° C., mold temperature of 130° C. and injection pressure of 1,000 kg/cm² to prepare injection molded sheets measuring 3 mm (thickness)×10 cm×12 cm.

The resulting molded sheets were washed with acetone, subjected to roughening treatment with a chromate solution, irradiated with light in the same manner as in Example 1, and then chemically plated with copper.

The results are shown in Table II.

TABLE II

| | Plating Properties | |
|---|---|---|
| Materials injection-molded | portion irradiated with light | portion not irradiated with light |
| Polymer A + 40% glass fiber | x | O |
| Polymer B + 40% glass fiber | x | O |
| Ryton R-4 | x | O | wherein O : plated, x: not plated.

It can be seen from the results in Table II that molded articles containing glass fiber also can be selectively chemically plated. Moreover, it can be seen that the present invention is also effective for a commercially available PPS.

EXAMPLE 4

Each of Polymers A and B was melt-pressed with a hot press at 330° C. and then rapidly cooled to prepare a sheet-like formed article of 0.25-mm thickness. The molded article was biaxially oriented 3.5 times in both longitudinal and crosswise directions by means of a film stretcher to produce a biaxially oriented film. The peripheral edge of the film was set with a 70 mm×70 mm metal frame and thermally fixed by heating at 260° C. for 10 minutes to obtain a thermally fixed film.

The thermally fixed film was irradiated with light and chemically plated in the same way as in Example 1.

As a result, the desired selective chemical plating was obtained by means of the irradiation with light on the thermally fixed film composed of either the Polymer A or Polymer B.

What is claimed is:

1. In the process of selectively chemical plating on a formed article composed of a polyarylene sulfide or a composition comprising a polyarylene sulfide as the predominant resin component which comprises irradiating a portion not to be plated of the formed article with light of a wavelength from about 300 to about 404 nm from an ultraviolet light source and then subjecting the formed article to chemical plating.

2. The method according to claim 1, in which the irradiation with the light is conducted for 0.01 second to 1,000 hours.

3. The method according to claim 2, in which the irradiation is conducted for 0.01 second to 100 hours.

4. The method according to claim 1, in which the polyarylene sulfide is selected from the group consisting of a poly-p-phenylene sulfide, and a p-/m-phenylene sulfide block copolymer, and mixtures thereof.

5. The method according to claim 2, in which the ultraviolet light source is a high-pressure mercury-vapor lamp, a low pressure mercury-vapor lamp, an ultrahigh pressure mercury-vapor lamp, a xenon lamp, a carbon arc lamp, or a halogen lamp.

* * * * *